United States Patent
Shi et al.

(10) Patent No.: US 9,805,773 B1
(45) Date of Patent: Oct. 31, 2017

(54) DUAL-RANGE CLOCK DUTY CYCLE CORRECTOR

(71) Applicant: Intel Corporation, Santa Clara, CA (US)

(72) Inventors: Dan Shi, Folsom, CA (US); Fangxing Wei, Folsom, CA (US); Michael J Allen, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/161,908

(22) Filed: May 23, 2016

(51) Int. Cl.
*H03K 5/156* (2006.01)
*G11C 7/10* (2006.01)
*H03K 5/05* (2006.01)
*G11C 7/22* (2006.01)

(52) U.S. Cl.
CPC .............. *G11C 7/10* (2013.01); *G11C 7/222* (2013.01); *H03K 5/05* (2013.01); *H03K 5/1565* (2013.01); *G11C 2211/4061* (2013.01)

(58) Field of Classification Search
CPC ... G11C 7/10; G11C 7/222; G11C 2211/4061; H03K 5/05; H03K 5/1565
See application file for complete search history.

(56) References Cited

U.S. PATENT DOCUMENTS

| | | | |
|---|---|---|---|
| 7,403,055 B2 * | 7/2008 | Minzoni .............. | G11C 7/1066 327/172 |
| 2014/0125390 A1 * | 5/2014 | Ma ...................... | H03K 5/1565 327/175 |
| 2014/0266362 A1 * | 9/2014 | Lee ...................... | H03K 5/1565 327/175 |
| 2015/0002201 A1 * | 1/2015 | Kitagawa ............ | H03K 5/1565 327/175 |

* cited by examiner

*Primary Examiner* — J. H. Hur
*Assistant Examiner* — Ajay Ojha
(74) *Attorney, Agent, or Firm* — Compass IP Law PC

(57) ABSTRACT

Examples may include techniques for dual-range clock duty cycle tuning of a clock signal used for an input/output data bus. A clock duty cycle of the clock signal is monitored to determine whether the clock duty cycle falls within a threshold of a 50 percent duty cycle. A dual-range tuning is then implemented until the clock duty cycle of the clock signal falls within the threshold.

22 Claims, 13 Drawing Sheets

1000

```
MONITOR A CLOCK DUTY CYCLE OF A CLOCK SIGNAL USED
FOR AN INPUT/OUTPUT DATA BUS
1002
```

```
DETERMINE WHETHER THE CLOCK DUTY CYCLE HAS A DUTY
CYCLE PERCENTAGE WITHIN A THRESHOLD PERCENTAGE OF
A TARGET DUTY CYCLE PERCENTAGE
1004
```

```
GENERATE MULTIPLE CONTROL SIGNALS RESPONSIVE TO
DETERMINING THE DUTY CYCLE PERCENTAGE FALLS OUTSIDE
THE THRESHOLD PERCENTAGE TO CAUSE A DUAL-RANGE
TUNING OF THE CLOCK DUTY CYCLE, THE MULTIPLE
CONTROL SIGNALS INCLUDING A FIRST CONTROL SIGNAL TO
CAUSE A FIRST RANGE OF THE DUAL-RANGE TUNING THAT
INCLUDES AT LEAST ONE COARSE ADJUSTMENT TO ONE OR
MORE RISING EDGES OF THE CLOCK SIGNAL TO COARSELY
TUNE THE CLOCK DUTY CYCLE AND INCLUDING A SECOND
CONTROL SIGNAL TO CAUSE A SECOND RANGE OF THE DUAL-
RANGE TUNING THAT INCLUDES AT LEAST ONE FINE
ADJUSTMENT TO ONE OR MORE FALLING EDGES OF THE
CLOCK SIGNAL TO FINELY TUNE THE CLOCK DUTY CYCLE
1006
```

```
INDICATE COMPLETION OF THE DUAL-RANGE TUNING OF THE
CLOCK DUTY CYCLE RESPONSIVE TO THE CLOCK DUTY CYCLE
OF THE CLOCK SIGNAL HAVING A DUTY CYCLE PERCENTAGE
WITHIN THE THRESHOLD PERCENTAGE THE TARGET DUTY
CYCLE PERCENTAGE
1008
```

FIG. 10

Storage Medium 1100

Computer Executable Instructions for 1000

*FIG. 11*

DUAL-RANGE CLOCK DUTY CYCLE CORRECTOR

TECHNICAL FIELD

Examples described herein are generally related to clock duty cycle correcting or tuning of a clock signal for use by an input/output data bus.

BACKGROUND

In some computing systems, a data bus such as an input/output data bus for a memory device may be arranged to operate with double data rate (DDR) transfers of data on both rising and falling edges of a clock signal. DDR may be utilized to achieve higher data transmission rates for accessing various types of volatile or non-volatile memory. A precision of a clock duty cycle is important due to both the rising and falling edges of the clock signal being utilized to enable the higher data transmission rates.

BRIEF DESCRIPTION OF THE DRAWINGS

FIG. 10 illustrates an example second logic flow.
FIG. 11 illustrates an example storage medium.

DETAILED DESCRIPTION

As contemplated by various examples, a precision of a clock duty cycle may be used when an input/output data bus for accessing a memory device is arranged to operate with DDR transfers of data on both rising and falling edges of a clock signal. Some operating specifications for DDR transfers of data may be dictated or required by various memory technologies. For example, a clock duty cycle may be required by these memory technologies to be corrected or tuned to be within 2% of a 50% duty cycle (e.g., 48% to 52%) in order to maintain an acceptable precision. The various memory technologies may include, but are not limited to, DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WI02 (Wide I/O 2 (WideIO2), JESD229-2, originally published by JEDEC in August 2014), HBM (HIGH BANDWIDTH MEMORY DRAM, JESD235, originally published by JEDEC in October 2013), and/or other technologies based on derivatives or extensions of such specifications. The various memory technologies may also include memory technologies currently in development that may include, but are not limited to, DDR5 (DDR version 5, currently in discussion by JEDEC), LPDDR5 (LPDDR version 5, currently in discussion by JEDEC), HBM2 (HBM version 2, currently in discussion by JEDEC), and/or other new technologies based on derivatives or extensions of these developing memory technologies.

According to some examples, duty cycle correction circuits or duty cycle correctors may be used to correct or tune a duty cycle of a clock signal for a memory device's input/output data bus arranged for DDR operation. Duty cycle correctors may include, but are not limited to, three common types. A first common type of duty cycle corrector may be a phase blender based duty cycle corrector. A second common type of duty cycle corrector may be an edge combiner based duty cycle corrector. A third common type of duty cycle corrector may be a slew rate controlled duty cycle corrector. The first two common types of duty cycle correctors usually have complicated designs and may require higher power consumption as compared to the third type of duty cycle corrector. However, the third common type of duty cycle corrector, slew rate controlled duty cycle corrector, may lack an ability for high precision tuning due to challenges associated with achieving small duty cycle step sizes for tuning or correcting a clock duty cycle.

Figure 1:
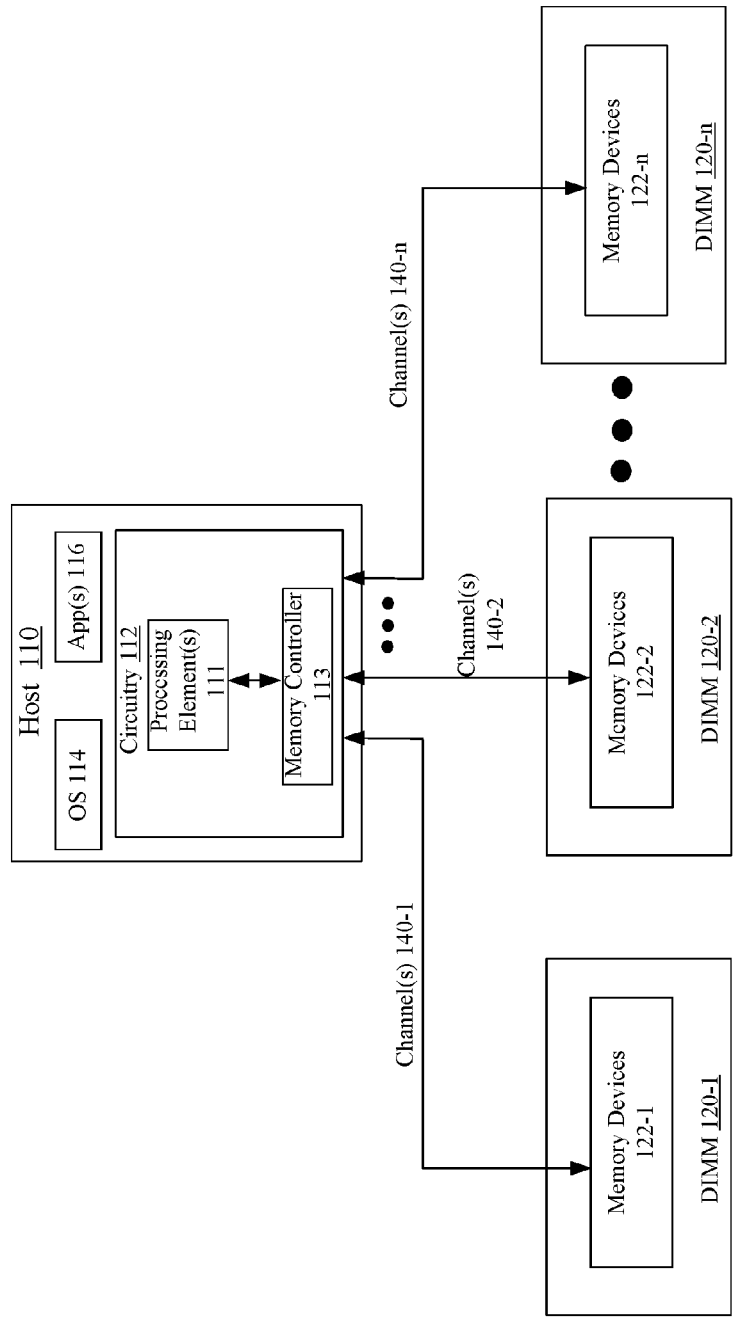
FIG. 1 illustrates an example system.

FIG. 1 illustrates a system 100. In some examples, as shown in FIG. 1, system 100 includes a host 110 coupled to dual in-line memory modules (DIMMs) 120-1 to 120-n, where "n" is any positive whole integer with a value greater than 2. For these examples, DIMMs 120-1 to 120-n may be coupled to host 110 via one or more channels 140-1 to 140-n. Channels 140-1 to 140-n and/or memory device 122-1 to 122-2 included with DIMMs 120-1 to 120-n may include input/output data buses arranged to operate using DDR. As described more below, logic and/or features located with a DIMM and/or memory devices may enable a DIMM and/or memory device to correct or tune a duty cycle of a clock signal used by the input/output data buses for greater precision via implementation of a dual-range tuning scheme. Although this disclosure primarily mentions memory devices, other devices such as input/output network devices or processing devices are contemplated as being coupled to an input/output data bus and may also benefit from dual-range tuning of a clock duty cycle of a clock signal used for applications where both clock edges are utilized.

In some examples, as shown in FIG. 1, host 110 may include an operating system (OS) 114, one or more applications (App(s)) 116 and circuitry 112. Circuitry 112 may include one or more processing element(s) 111 (e.g., processors or processor cores) coupled with a memory controller 113. Host 110 may include, but is not limited to, a personal computer, a desktop computer, a laptop computer, a tablet, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof.

In some examples, memory devices 122-1 to 122-n may include various types of volatile and/or non-volatile memory. Volatile memory may include, but is not limited to, random-access memory (RAM), Dynamic RAM (D-RAM), double data rate synchronous dynamic RAM (DDR SDRAM), static random-access memory (SRAM), Thyristor RAM (T-RAM) or zero-capacitor RAM (Z-RAM). Non-volatile memory may include, but is not limited to, non-volatile types of memory such as 3-D cross-point memory that are byte or block addressable. These block addressable or byte addressable non-volatile types of memory for memory devices 122-1 to 122-n may include, but are not limited to, memory that uses chalcogenide phase change material (e.g., chalcogenide glass), multi-threshold level NAND flash memory, NOR flash memory, planar or three-dimensional NAND, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

According to some examples, memory devices 122-1 to 122-n including volatile and/or non-volatile types of memory may operate in accordance with a number of memory technologies, such as the previously mentioned DDR5, LPDDR5 or HBM2, and/or other technologies based on derivatives or extensions of such specifications for these developing memory technologies. Memory devices 122-1 to 122-n may also operate in accordance with other memory technologies such as, but are not limited to, DDR4, LPDDR4, WIO2, HBM, and/or other technologies based on derivatives or extensions of these specifications for these other memory technologies.

In some examples, DIMMs such as DIMMs 120-1 to 120-n may be arranged in one or more types of single of dual channel configurations. DIMMs such as DIMMs 120-1 to 120-n may also be designed to function as a registered DIMM (RDIMM), a load reduced DIMM (LRDIMM), a fully-buffered DIMM (FB-DIMM), an unbuffered DIMM (UDIMM) or a small outline (SODIMM). Examples are not limited to only these DIMM designs.

In some examples, memory devices 122-1 to 122-n at DIMMs 120-1 to 120-n may include all or combinations of types of volatile or non-volatile memory. For example, memory devices 122-1 at DIMM 120-1 may include volatile memory on a front or first side and may include non-volatile memory on a back or second side. In other examples, a hybrid DIMM may include combinations of non-volatile and volatile types of memory for memory devices 122-1 on either side of DIMM 120-1. In other examples, all memory devices 122-1 may be either volatile types of memory or non-volatile types of memory. In some examples, multiple channels may be coupled with memory devices maintained on a DIMM and in some examples, separate channels may be routed to different non-volatile/volatile types and/or groups of memory devices. For example, a first channel to memory devices including non-volatile memory and a second channel to memory devices including volatile memory. In other examples, a first channel may be routed to memory devices on a first side of a DIMMs and a second channel to memory devices on a second side of the DIMMs. Examples are not limited to the above examples of how multiple channels may be routed to memory devices included on a single DIMMs.

Figure 2:
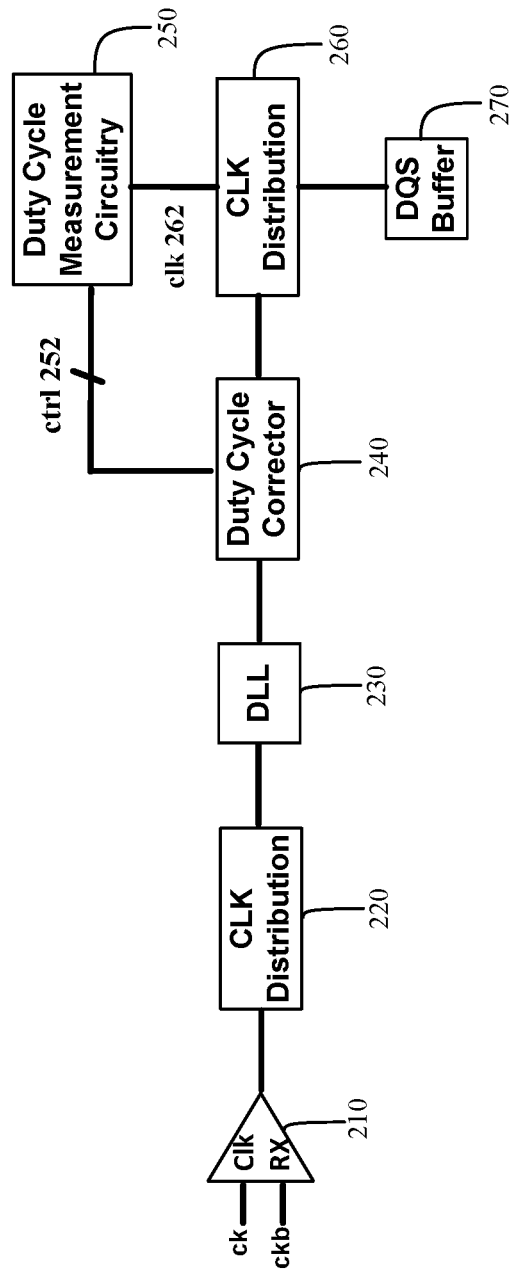
FIG. 2 illustrate an example clock distribution system.

FIG. 2 illustrates an example clock distribution system 200. In some examples, as shown in FIG. 2, clock distribution system 200 includes various circuitry such as a clock receive (Clk RX) 210, a CLK distribution 220, a delay-locked loop (DLL) 230, a duty cycle corrector 240, a duty cycle measurement circuitry 250, a CLK distribution 260 or a data strobe (DQS) buffer 270. Clock distribution system 200 may be arranged to provide clock signals having tuned duty cycles to match precision requirements associated with memory devices having input/output data buses arranged to operate with DDR. In some examples, Clk RX 210 may receive a differential clock signals (ck/ckb), CLK distribution 220 may distribute these received clock signals to DLL 230, the DLL 230 may change a phase of these received clock signals to align differential clock signals with a DQ strobe (DQS) and duty cycle corrector 240 may include logic and/or features to receive information via control (ctrl) 252 from duty cycle measurement circuitry 250 based on sensed measurements of a corrected clk 262 distributed by CLK distribution 260 to DQS buffer 270. DQS buffer 270 may be arranged to generate or receive a differential strobe pair which acts as a clock for data read from or written to a memory device having an input/output data bus.

In some examples, duty cycle corrector 240, as described more below, may include circuitry or other logic to tune a flight time of rising and falling edges of a clock signal. This tuning of the flight time may result in a clock duty cycle shift. For example, duty cycle measurement circuitry 250 may sense or measure one or more clock duty cycles of the clock signal at clk 262. Logic and/or features of duty cycle measurement circuitry 250 may send control information via ctrl 252 to enable duty cycle corrector 240 to conduct both coarse and fine range tuning of one or more clock duty cycles of the clock signal at clk 262. Implementation of both coarse and fine range tuning may facilitate a dual-range tuning scheme that may allow for greater precision when tuning flight times of rising and falling edges of the clock signal at clk 262 to tune or correct its clock duty cycle.

Figure 3:
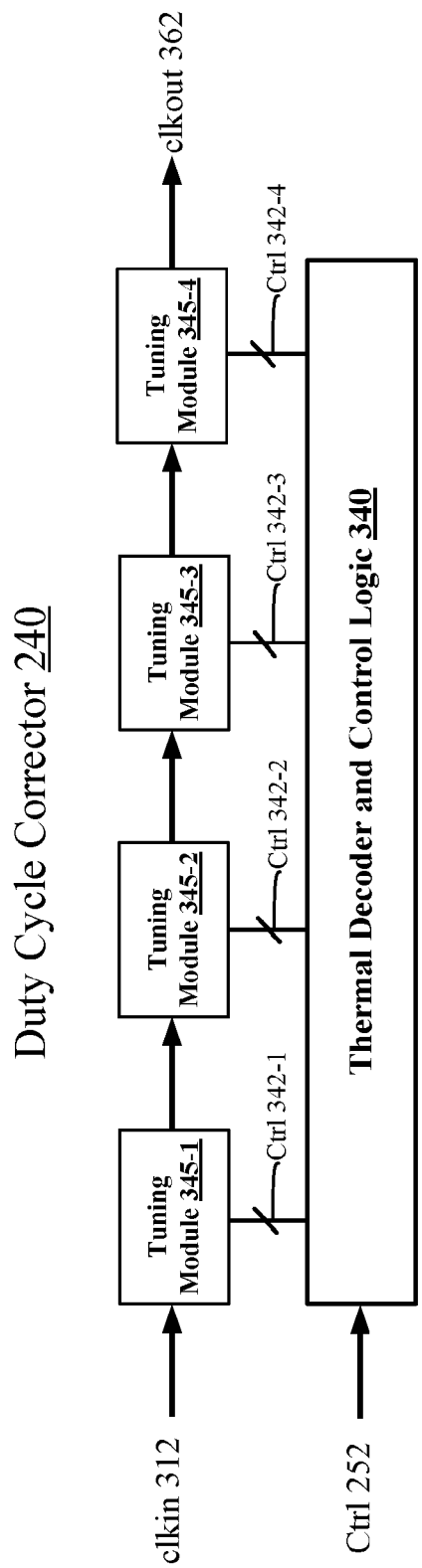
FIG. 3 illustrates an example duty cycle corrector.

FIG. 3 illustrates an example of a duty cycle corrector. As shown in FIG. 3, the duty cycle corrector includes duty cycle corrector 240 from clock distribution system 200. In some examples, duty cycle corrector 240 may include a thermal decoder and control logic 340 and several stages of tuning modules 345-1 to 345-4. Examples are not limited to four tuning modules, more or less tuning modules are contemplated.

According to some examples, information may be received via ctrl 252 (e.g., from duty cycle measurement circuitry 250) to indicate how each tuning module is to be configured to tune rising or falling edges of a clock signal. As described more below, each tuning module of tuning modules 345-1 to 345-4 may include one current-starving inverter and stacked p-type metal-oxide-semiconductor field effect transistors (P-MOSFET) and n-type metal-oxide-semiconductor field effect transistors (N-MOSFET), hereinafter referred to as PMOS transistors and NMOS transistors. The stacked PMOS and NMOS transistors included in each of tuning modules 345-1 to 345-4 may be responsive to respective control information 342-1 to 342-4 (e.g., thermometer codes) to tune or correct rising and/or falling edges of the clock signal at clkin 312 to result in a tuned or corrected clock duty cycle of the clock signal at clkout 362. As described more below, the control information, for example, may control current-source legs for either the PMOS or NMOS transistors to tune a clock duty cycle of a clock signal outputted from a duty cycle corrector arranged in a similar configuration as shown in FIG. 3 for duty cycle corrector 240.

Figure 4:
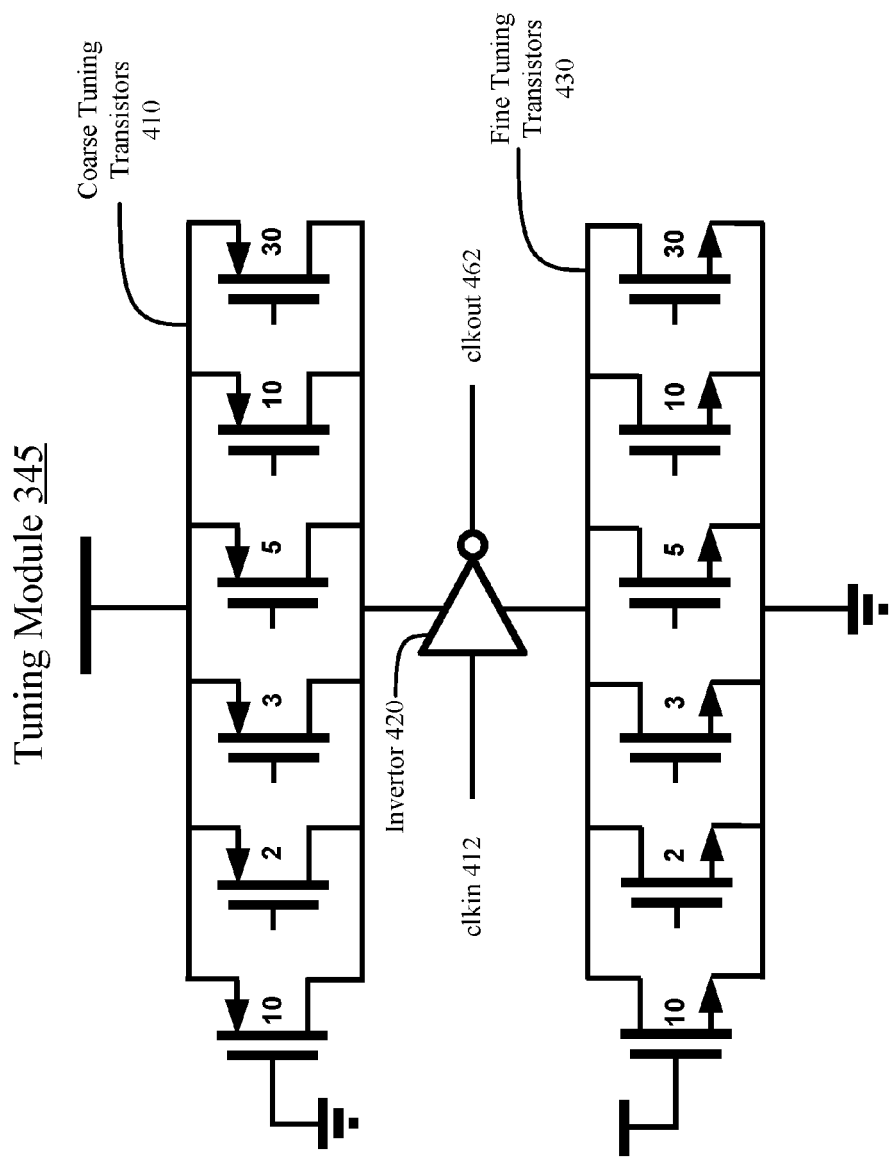
FIG. 4 illustrates an example tuning module.

FIG. 4 illustrates an example tuning module. In some examples, as shown in FIG. 4, the tuning module may include tuning module 345. For these examples, tuning module 345 may represent circuitry included in each of tuning modules 345-1 to 345-4 of duty cycle corrector 240 shown in FIG. 3. As shown in FIG. 4, tuning module 345 includes coarse tuning transistors 410, an inverter 420 and fine tuning transistors 430. According to some examples, coarse tuning transistors 410 may include PMOS transistors and fine tuning transistors 430 may include NMOS transistors.

In some examples, tuning module 345 may be capable of slew rate control duty cycle correction. For these examples, inverter 420 may be a current-starving inverter that is utilized to change a rising edge of a clock signal inputted at clkin 412 by adjusting a current source to coarse tuning transistors 410 to enable a coarse tuning of a clock duty cycle of the clock signal outputted at clkout 462. Inverter 420 may also be utilized to change a falling edge of the clock signal inputted at clkin 412 by adjusting a current source to fine tuning transistors 430 to enable a fine tuning of the clock duty cycle of the clock signal outputted from tuning module 345 outputted at clkout 462.

According to some examples, current-source legs for transistors included in coarse tuning transistors 410 and fine tuning transistors 430 may be controlled by a code such as a thermometer code that may be decoded by thermal decoder and control logic 340. For example, the thermometer code may be based on information received by thermal decoder and control logic 340 via ctrl 252. The information received via ctrl 252 may have been sent by logic and/or features of duty cycle measurement circuitry 250 responsive to sensed or measured clock duty cycle of the clock signal and a determination of whether the sensed or measured clock duty cycle of the clock signal falls within an acceptable tolerance of a 50% duty cycle (e.g., 48% to 52%).

In some examples, transistors in current sources for coarse tuning transistors 410 and fine tuning transistors 430 may be sized according to a 1/transistor gate width (W) ratio to achieve linear delay tuning. For example, as shown in FIG. 4, transistors may be sized to have a ratio 1/10 (always on), 1/(10+2), 1/(10+2+3), 1/(10+2+3+5), 1/(10+2+3+5+10) and 1/(10+2+3+5+10+30). These ratios may enable a linear increase in biasing currents (e.g., a 6:5:4:3:2:1 ratio) based on codes such as thermometer codes that may allow for a uniform duty cycle step size correction for increasing thermometer codes. For example, at least six different thermometer codes may be used to establish the six different ratios of 6:5:4:3:2:1 for coarse tuning transistors 410 and a separate six different thermometer codes may be used to establish the same six different ratios for fine tuning transistors 430. Examples are not limited to six different ratios, any number of ratios are contemplated.

According to some examples, a mismatch between PMOS transistor and NMOS transistor threshold voltages may create a relatively large difference in biasing currents. The relatively large difference in biasing currents may result in a duty cycle correction step size mismatch between coarse tuning transistors 410 and fine tuning transistors 430 (relative difference may depend on process model and could be up to a mismatch ratio of 6:1 or higher mismatch ratios). It is due to this mismatch in duty cycle step size corrections that a dual-range tuning scheme may be implemented that includes utilizing coarse tuning transistors 410 to tune or correct a clock duty cycle to cause a large/coarse range or step size correction to the clock duty cycle. In a separate act of tuning or correcting the clock duty cycle, fine tuning transistors 430 may be utilized to tune or correct the clock duty cycle to cause a relatively smaller/fine range or step size correction to the clock duty cycle.

Figure 5A:
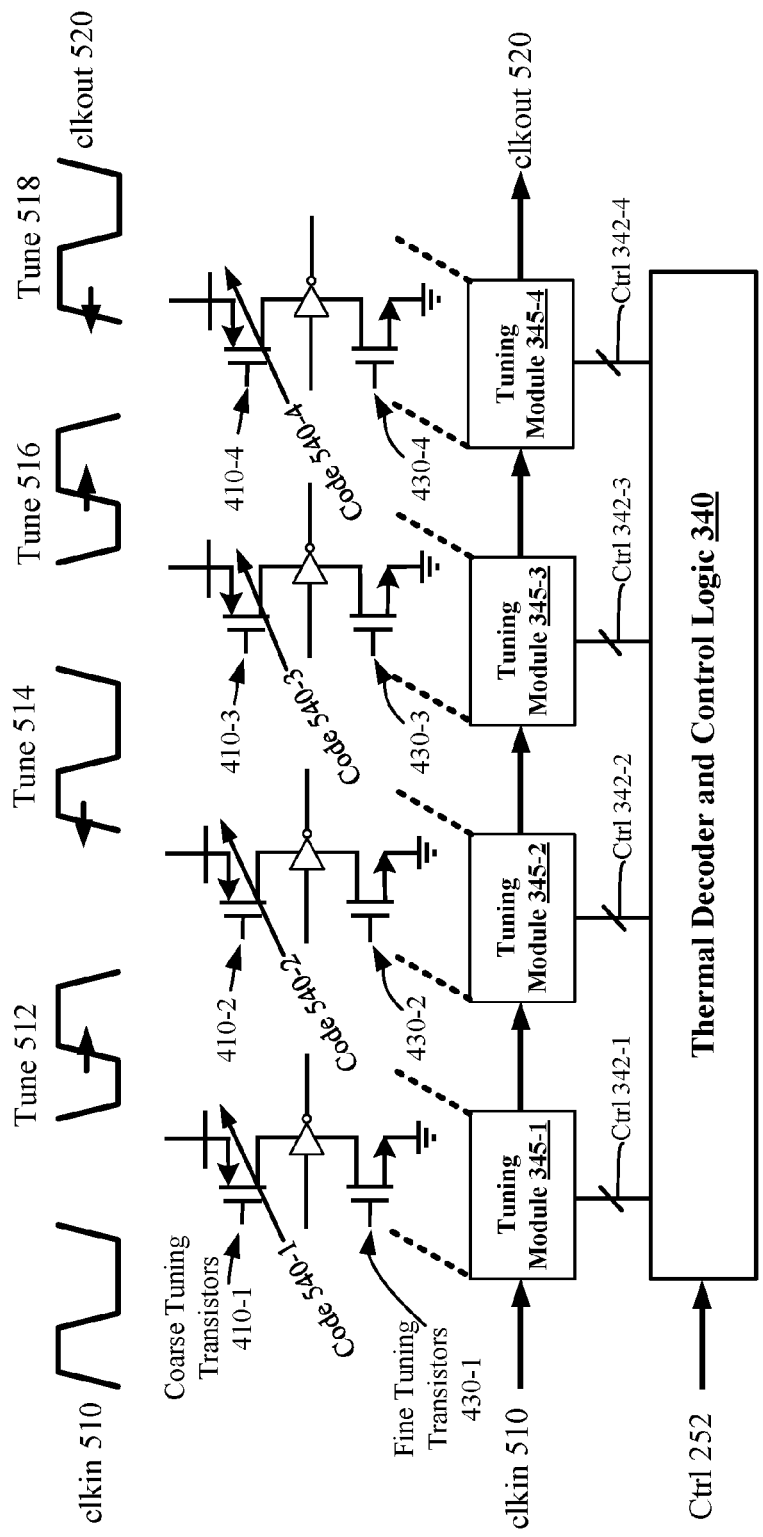
FIGS. 5A-B illustrate example tuning schemes.
Figure 5B:
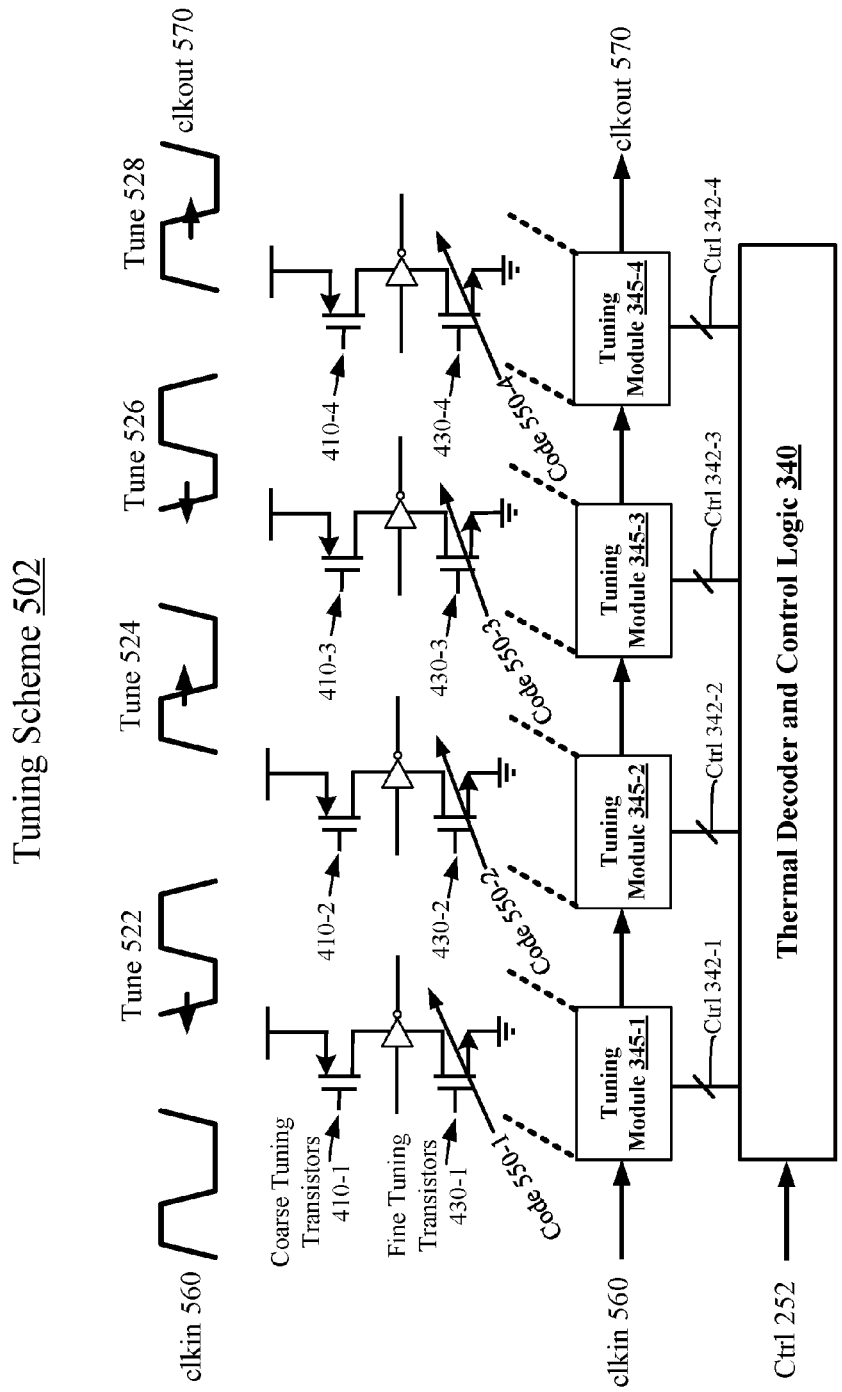

FIGS. 5A-B illustrate a dual-range tuning scheme including tuning schemes 501 and 502. In some examples, as shown in FIG. 5A, tuning scheme 501 may utilize coarse tuning transistors 410-1 to 410-4 included in respective tuning modules 345-1 to 345-4 to enable a coarse tuning of a clock duty cycle of a clock signal inputted at clkin 510 that results in coarsely corrected or tuned clock duty cycle of the clock signal outputted at clkout 520. As shown in FIG. 5B, tuning scheme 502 may utilize fine tuning transistors 430-1 to 430-4 included in respective tuning modules 345-1 to 345-4 to enable a fine tuning of a clock duty cycle of a clock signal inputted at clkin 520 that results in a finely corrected or tuned clock duty cycle of the clock signal outputted at clkout 530.

According to some examples, as briefly mentioned above for FIG. 4, current-source legs for transistors included in coarse tuning transistors 410 may be controlled by a code such as a thermometer code. For example, as shown in FIG. 5A, code 540-1 may control current-source legs of selective PMOS transistors included in coarse tuning transistors 410-1. Code 540-1 may include a thermometer code (e.g., a 6-bit code such as 000001) received from thermal decoder and control logic 340 via ctrl 342-1. For this example, code 540-1 sent by thermal decoder and control logic 340 may be based on information received via ctrl 252. This information received via ctrl 252 may either be responsive to sensed or measured clock duty cycles by duty cycle measurement circuitry 250 or may be responsive to initial coarse codes that may be loaded upon initialization or startup of a memory device that includes clock distribution system 200. Codes 540-2 to 540-4 may similarly control respective current-source legs of selective PMOS transistors included in respective coarse tuning transistors 410-2 to 410-4 (e.g., select the size ratios among 6:5:4:3:2:1) based on respective thermometer codes received from thermal decoder and control logic 340 via respective ctrl 342-2, ctrl 342-3 and ctrl 341-4. According to some examples, as described more below, codes 540-1 to 540-4 may be incremented or decremented in a balanced matter such that size ratios for coarse tuning transistors 410-1 to 410-4 of each respective tuning module of tuning modules 345-1 to 345-4 may be somewhat similar. For example, coarse tuning transistors 410-1 to 431-4 may all have size ratios of 4 or fine tuning transistors may have size ratios of a combination of 3, 4 or 5.

In some examples, depending on the thermometer code included in code 540-1, a clock duty cycle of a clock signal inputted at clkin 510 may be tuned at tune 512 to cause the rising edge of the clock signal to be adjusted by controlling current-source legs of selective PMOS transistors included in coarse tuning transistors 410-1 of tuning module 345-1. In a similar manner, codes 540-2, 540-3 and 540-4 may cause rising edges of the clock signal to be adjusted at respective tunes 514, 516 and 518 by controlling current-source legs of selective PMOS transistors included in respective coarse tuning transistors 410-2, 410-3 and 410-4 of respective tuning modules 345-2, 345-3 and 345-4. For these examples, a tuned or corrected clock duty cycle of the clock signal outputted at clkout 520 may be a coarsely tuned or corrected clock duty cycle. If the coarsely tuned clock duty cycle is within a threshold percentage of a 50% duty cycle (e.g., within 2%), no subsequent tuning may be required and the tuned or corrected clock duty cycle of the clock signal outputted at clkout 520 may be locked.

According to some examples, as briefly mentioned above for FIG. 4, current-source legs for transistors included in fine tuning transistors 430 may also be controlled by a code such as a thermometer code. For example, as shown in FIG. 5B, code 550-1 may control current-source legs of selective NMOS transistors included in fine tuning transistors 430-1. Code 550-1 may include a thermometer code (e.g., a 6-bit code such as 011001) received from thermal decoder and control logic 340 via ctrl 342-1. For this example, code 550-1 sent by thermal decoder and control logic 340 may be based on information received via ctrl 252. This information received via ctrl 252 may either be responsive to sensed or measured clock duty cycles by duty cycle measurement circuitry 250 or may be responsive to initial fine codes that may be loaded upon initialization or startup of a memory device that includes clock distribution system 200. Codes 550-2 to 550-4 may similarly control respective current-source legs of selective NMOS transistors included in respective fine tuning transistors 430-2 to 430-4 (e.g., change size ratios of 6:5:4:3:2:1) based on respective thermometer codes received from thermal decoder and control logic 340 via respective ctrl 342-2, ctrl 342-3 and ctrl 342-4. According to some examples, as described more below, codes 550-1 to 550-4 may be incremented or decremented in a balanced matter such that size ratios for fine tuning transistors 430-1 to 430-4 of each respective tuning module of tuning modules 345-1 to 345-4 may be somewhat similar. For example, fine tuning transistors 430-1 to 430-4 may all have size ratios of 4 or at least some fine tuning transistors may have size ratios of 3 or 5.

In some examples, a clock duty cycle of a clock signal inputted at clkin 560 may be substantially similar to the coarsely tuned clock duty cycle of the clock signal outputted at clkout 520 mentioned above for FIG. 5A. In other words, a clock duty cycle of the clock signal inputted at clkin 560 may match a clock duty cycle of the clock signal outputted at clkout 520 that has been coarsely tuned or corrected according to tuning scheme 501. For these examples, depending on the thermometer code included in code 550-1, the clock duty cycle of the clock signal inputted at clkin 560 may be tuned at tune 522 to cause the falling edge of the clock signal to be adjusted by controlling current-source legs of selective NMOS transistors included in fine tuning transistors 430-1 of tuning module 345-1. In a similar manner, codes 550-2, 550-3 and 550-4 may cause falling edges of the clock signal to be adjusted at respective tunes 524, 526 and 528 by controlling current-source legs of selective NMOS transistors included in respective fine tuning transistors 430-2, 430-3 and 430-4 of respective tuning modules 345-2, 345-3 and 345-4. For these examples, a clock duty cycle of the clock signal outputted at clkout 570 may be a finely tuned clock duty cycle that may be tuned or corrected according to tuning scheme 502. If the finely tuned clock duty cycle is within a threshold percentage of a 50% duty cycle (e.g., within 2%), no subsequent fine or coarse tuning may be required and the tuned or corrected clock duty cycle of the clock signal at clkout 570 may be locked. If the tuned or corrected clock duty cycle is still not within the threshold percentage and/or codes are out of range, the tuned or corrected clock duty cycle of the clock signal outputted at clkout 570 may be further corrected or tuned using coarse tuning transistors according to tuning scheme 501 and then if still more correction or tuning is needed, fine tuning using fine tuning transistors according to tuning scheme 502 is used. This dual-range tuning scheme may continue until a tuned or corrected clock duty cycle of the clock signal outputted from duty cycle corrector 240 has a tuned or corrected clock duty cycle that falls within the threshold percentage of the 50% duty cycle.

Figure 6:
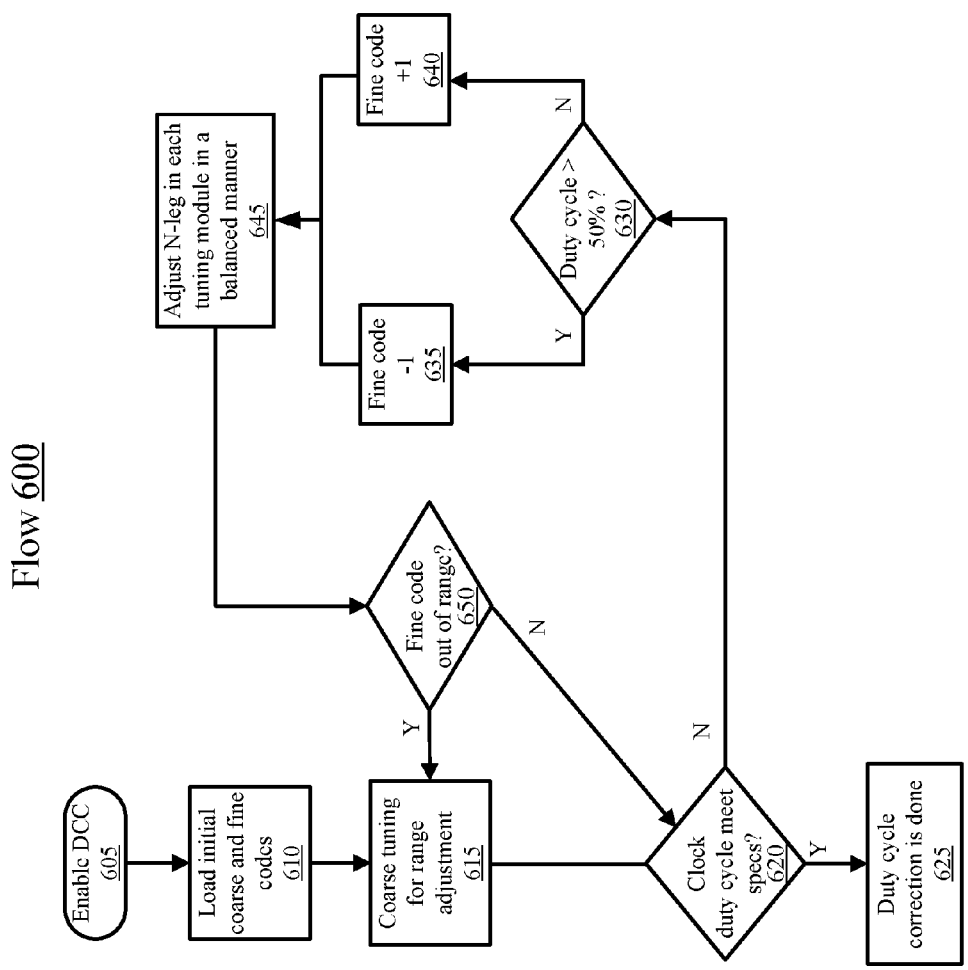
FIG. 6 illustrates an example first logic flow.

FIG. 6 illustrates an example first logic flow 600. In some examples, logic flow 600 may illustrate an example processes or operations for a dual-range tuning scheme to correct or tune a duty clock cycle of a clock signal utilized by an input/output data bus such as an input/output data bus for accessing a memory device arranged to operate using DDR. For these examples, logic flow 600 may be implemented by elements of clock distribution system 200 as described above for FIGS. 2-4. These elements of clock distribution 200 may implement the dual-range tuning scheme using tuning schemes 501 and/or 502 as shown and described in FIGS. 5A-B. However, the example processes or operations are not limited to implementation using elements of clock distribution system 200 or to the use of tuning schemes 501 and/or 502.

At block 605, duty cycle correction may be enabled to include correcting or tuning a duty clock cycle of a clock signal used by an input/output data bus that may be arranged to operate using DDR. In some examples, memory devices 122-1 to 122-n and/or DIMMs 120-1 to 122-n may be coupled to the input/output data bus and may require that the clock duty cycle of the clock signal be corrected or tuned to fall within a threshold percentage of a 50% duty cycle (e.g., within 2%). Duty cycle corrector 240 may be activated or enabled to perform the duty cycle correction.

At block 610, initial coarse and fine codes may be loaded into respective coarse and fine transistors included in tuning modules 345-1 to 345-4 of duty cycle corrector 240. The initial coarse and fine codes may include thermometer codes. In some examples, a static clock duty cycle adjustment may correct initial clock duty cycle degradation or shifting due to possible imbalances in recently initialized memory devices or DIMMs coupled to the input/output data bus.

At block 615, coarse tuning for range adjustment to the clock duty cycle may be implemented first. The coarse tuning for range adjustment may include implementing tuning scheme 501. In some examples, a current source leg of PMOS transistors (P-legs) included in each tuning module may be adjusted in a balanced order based on a coarse code being either decremented or incremented. The decremented or incremented coarse code may be decoded by thermal decoder and control logic 340 to generate separate thermometer codes for each of tuning modules 345-1 to 345-4. The separate thermometer codes may then be sent to coarse tuning transistors 410-1 to 410-4 to adjust the P-legs of these PMOS transistors in the balanced order.

For a decremented coarse code, in some examples, each of the thermometer codes may have been decremented by a value of 1. For example, a 6-bit value of 000001 may be decremented to a 6-bit value of 000000 for coarse tuning transistors 410-1 of tuning module 345-1, a different 6-bit value of 001000 may be decremented to a 6-bit value of 000111 for coarse tuning transistors 410-2 of tuning module 354-2 and similar decrements may be made to different 6-bit values for each coarse tuning transistors 410-3 and 410-4 of tuning modules 345-3 and 345-4. The decremented thermometer codes may cause a linear decrease in biasing current through coarse tuning transistors 410-1 to 410-4 and thus correct or tune the clock duty cycle of the clock signal from a duty cycle that is above 50% (e.g., 56%) to a lower percentage duty cycle (e.g., 53%).

For an incremented coarse code, according to some examples, each of the thermometer codes may have been incremented by a value of 1. For example, a 6-bit value of 000001 may be incremented to a 6-bit value of 000010 for coarse tuning transistors 410-1 of tuning module 345-1, a different 6-bit value of 001000 may be incremented to a 6-bit value of 001001 for coarse tuning transistors 410-2 of tuning module 354-2 and similar increments may be made to different 6-bit values for each coarse tuning transistors 410-3 and 410-4 of tuning modules 345-3 and 345-4. The incremented thermometer codes may cause a linear increase in biasing current through coarse tuning transistors 410-1 to 410-4 and thus correct or tune the clock duty cycle of the clock signal from a duty cycle that is below 50% (e.g., 43%) to a higher percentage duty cycle (e.g., 46%).

At decision block 620, a determination is made whether the clock duty cycle of the clock signal meets applicable specifications. For example, if memory devices 122-1 to 122-n were arranged to operate according to one or more current or developing memory technologies such as DDR5, LPDDR5, HBM2, DDR4, LPDDR4, WIO2 or HBM. These memory technologies may include specifications for clock signals to have a clock duty cycle that is corrected or tuned to be within a 2% threshold percentage of a 50% duty cycle to minimize possible timing errors caused by the clock duty cycle of the clock signal shifting too far below or above a 50% duty cycle. If the clock duty cycle of the clock signal meets these applicable specifications, the process moves to 625. Otherwise, the process moves to decision block 650 for fine tuning.

At block 625, duty cycle correction for the clock duty cycle of the clock signal is done. In some examples, a lock on this tuned/corrected clock duty cycle of the clock signal may be declared. The clock duty cycle of the clock signal output from duty cycle corrector 240 may then be locked for use by the input/output data bus for DDR transfers of data on both rising and falling edges of the clock signal.

At decision block 630, if the clock duty cycle of the clock signal is measured or sensed to be greater than a 50% duty cycle, the process moves to block 635. If not, the process moves to block 640. In some examples, the clock duty cycle may be measured or sensed by duty cycle measurement circuitry 250. For these examples, logic and/or features of duty cycle measurement circuitry 250 may determine whether the clock duty cycle is greater than a 50% duty cycle.

At block 635, a fine code may be decremented by a value of 1. In some examples, the logic and/or features of duty cycle measurement circuitry 250 may send information to duty cycle corrector 240 to indicate decrementing the fine code by the value of 1 due to the clock duty cycle having a duty cycle greater than 50%. The decremented fine code may be decremented in relation to the initial fine code that was loaded at block 610 or a previous fine code separate from the initial fine code.

At block 640, a fine code may be incremented by a value of 1. In some examples, the logic and/or features of duty cycle measurement circuitry 250 may send information to duty cycle corrector 240 to indicate incrementing the fine code by the value of 1 due to the clock duty cycle having a duty cycle less than 50%. The incremented fine code may be incremented in relation to the initial fine code that was loaded at block 610 or a previous fine code separate from the initial fine code.

At block 645, a current source leg of CMOS transistors (C-legs) included in each tuning module may be adjusted in a balanced order based on whether the fine code was decremented or incremented. The decremented or incremented fine code may be decoded by thermal decoder and control logic 340 to generate separate thermometer codes for each of tuning modules 345-1 to 345-4. The separate thermometer codes may then be sent to fine tuning transistors 430-1 to 430-4 to adjust the C-legs of these CMOS transistors in the balanced order.

For a decremented fine code, in some examples, each of the thermometer codes may have been decremented by a value of 1. For example, a 6-bit value of 011101 may be decremented to a 6-bit value of 011100 for fine tuning transistors 430-1 of tuning module 345-1, a different 6-bit value of 011111 may be decremented to a 6-bit value of 011110 for fine tuning transistors 430-2 of tuning module 354-2 and similar decrements may be made to different 6-bit values for each fine tuning transistors 430-3 and 430-4 of tuning modules 345-3 and 345-4. The decremented thermometer codes may cause a linear decrease in biasing current through fine tuning transistors 430-1 to 430-4 and thus correct or tune the clock duty cycle of the clock signal from a duty cycle that is above 50% (e.g., 53%) to a lower percentage duty cycle (e.g., 52.5%).

According to some examples, for an incremented fine code, each of the thermometer codes may have been incremented by a value of 1. For example, a 6-bit value of 011101 may be incremented to a 6-bit value of 011110 for fine tuning transistors 430-1 of tuning module 345-1, a different 6-bit value of 011111 may be incremented to a 6-bit value of 100000 for fine tuning transistors 430-2 of tuning module 354-2 and similar increments may be made to different 6-bit values for each fine tuning transistors 430-3 and 430-4 of tuning modules 345-3 and 345-4. The incremented thermometer codes may cause a linear increase in biasing current through fine tuning transistors 430-1 to 430-4 and thus correct or tune the clock duty cycle of the clock signal from a duty cycle that is below 50% (e.g., 46%) to a higher percentage duty cycle (e.g., 46.5%).

At decision block 650, a determination may be made as to whether fine codes have been decremented or incremented such that the fine code is now out of range. If out of range, the process moves to block 615. Otherwise, the process moves to decision block 620. In some examples, the range may be based on a mismatch in duty cycle step size corrections between coarse tuning transistors 410-1 to 410-4 and fine tuning transistors 430-1 to 430-4. For example, duty cycle step size corrections for coarse tuning transistors 410-1 to 410-4 may be 3 to 6 times greater for each increment or decrement of a given coarse code as compared to duty cycle step size corrections for fine tuning transistors 430-1 to 430-4. According to some examples, out of range may be based on a 6-bit fine code for each fine tuning transistor of fine tuning transistors having a minimum value (e.g., 000000) and a maximum value (e.g., 101111). The range may be exceeded if the fine code is incremented or decremented to cause the fine code to reach the minimum value (if decremented) or the maximum value (if incremented).

Figure 7:
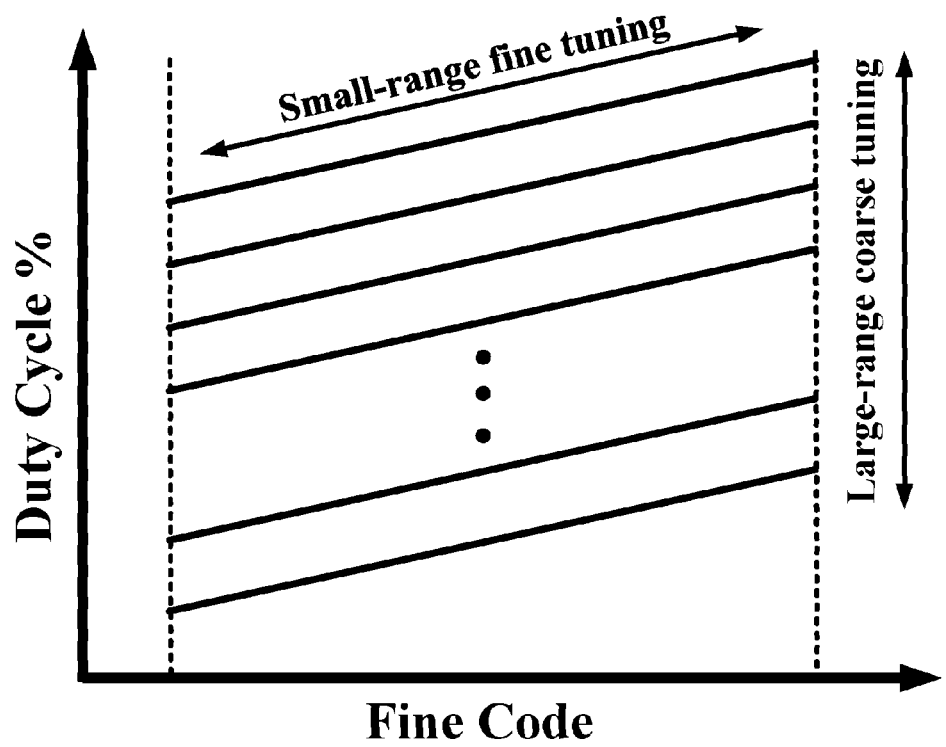
FIG. 7 illustrates an example duty cycle correction ranges.

FIG. 7 illustrates an example duty cycle correction ranges 700. In some examples, duty cycle correction ranges 700 depicts how decreasing or increasing coarse/fine codes for a duty cycle corrector such as duty cycle corrector 240 may allow for adjustments to a duty cycle % for a clock duty cycle of a clock signal. As shown in FIG. 7, each diagonal line rising from the left to right may represent a small-range fine tuning that falls within a given large-range coarse tuning. For example, small-range fine tuning may allow for 0.5% adjustments or corrections of the duty cycle % for the clock duty cycle for each increment or decrement of a fine code at each tuning module 345-1 to 345-2 that may be decoded by thermal decoder and control logic 340. In examples of six possible change size ratios such as 6:5:4:3:2:1, the small-range tuning of each diagonal line may cover approximately a maximum 3.0% adjustment or correction of the duty cycle % for increments or decrements of the fine code. Meanwhile, large-range coarse tuning may allow for relatively larger 3% adjustment for each increment or decrement of a coarse code that may be decoded by thermal decoder and control logic 340. Examples are not limited to 0.5% to 3% adjustments having a 6:1 ratio. Other ratios besides a 6:1 ratio are contemplated.

In some examples, as shown in FIG. 7, some overlap may exist between separate diagonal lines. For example, the point where each lower diagonal line's upper left intersects with the right dotted-line may be higher on the duty cycle % axis than the point where the each higher diagonal line's lower left intersects with the left dotted-line.

According to some examples, once a fine code has been incremented or decremented to a point where the duty cycle % of the adjusted clock duty cycle of a clock signal intersects with the top or bottom of the slope of a given small-range fine tuning line, the fine code for this part of a dual-range tuning is deemed as being out of range. For these examples, a coarse code may then be incremented or decremented along the large-range coarse tuning that results in a different diagonal line, provided that the coarse code does not result in the duty cycle % for the clock duty cycle meeting applicable specifications (e.g., within 1% or 2% of a 50% duty cycle). This dual-range tuning may allow for a lock on the clock duty cycle of the clock signal that may have relatively low clock duty cycle errors due to an ability to both coarsely and finely tune the clock duty cycle to a relatively high precision.

Figure 8:
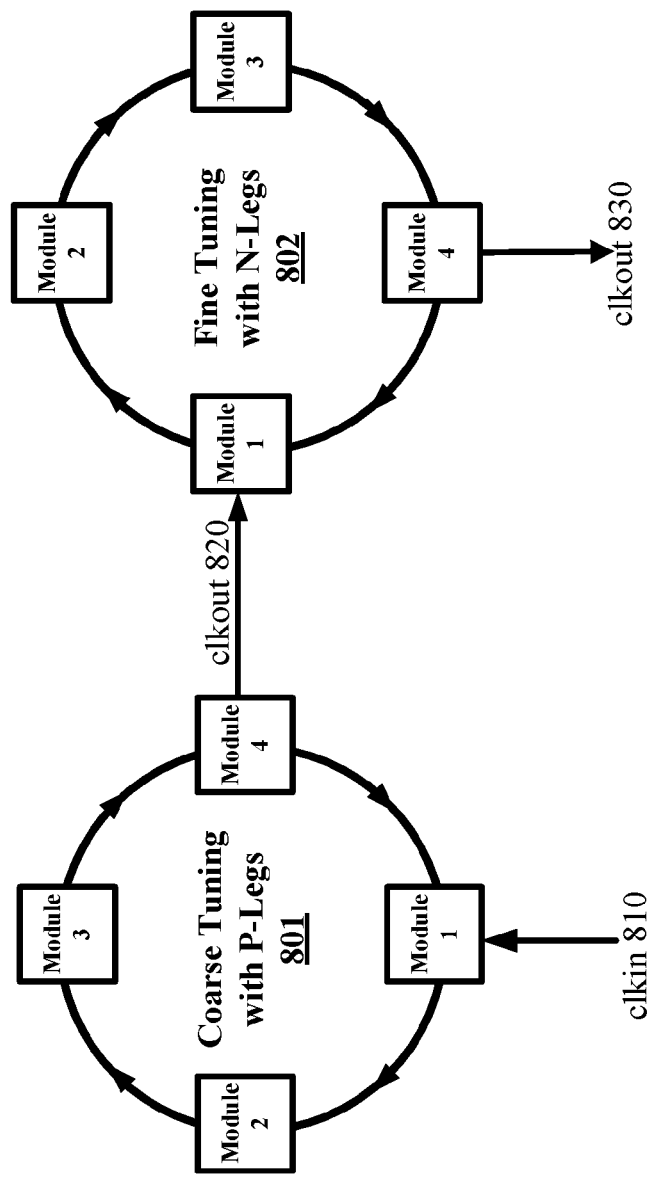
FIG. 8 illustrates an example dual-range tuning scheme.

FIG. 8 illustrates an example dual-range tuning scheme 800. In some examples, dual-range tuning scheme 800 shown in FIG. 8 may be a high-level depiction of the tuning schemes mentioned above in FIGS. 5A-B and for logic flow 600 shown in FIG. 6. For example, coarse tuning with P-legs 801 based on a duty clock cycle of a clock signal inputted at clkin 810 may correspond to tuning scheme 501 shown in FIG. 5A that includes selective coarse tuning transistors of each tuning module being adjusted in a balanced order. The balanced order may be based on whether a coarse code is to be decremented or incremented as mentioned above for block 635 of logic flow 600 to generate a coarsely adjusted clock duty cycle of the clock signal at clkout 820. As mentioned previously, the coarse code may be incremented or decremented in a balanced matter such that size ratios for coarse tuning transistors of each respective tuning module may be somewhat similar.

According to some examples, if the coarsely adjusted clock duty cycle of the clock signal outputted at clkout 820 falls within a threshold percentage of a 50% duty cycle, a fine tuning with N-legs 802 may be implemented and may further adjust the coarsely adjusted clock duty cycle of the clock signal outputted at clkout 820. The fine tuning with N-legs 802 may correspond to tuning scheme 502 shown in FIG. 5B that includes selective fine tuning transistors of each tuning module being adjusted in a balanced order. The balanced order may be based on whether a fine code is to be decremented or incremented as mentioned above for block 645 of logic flow 600 to generate a coarsely/finely adjusted (dual-range tuned) clock duty cycle of the clock signal outputted at clkout 830. As mentioned previously, the fine code may be incremented or decremented in a balanced matter such that size ratios for fine tuning transistors of each respective tuning module may be somewhat similar. For these examples, the coarsely/finely adjusted clock duty cycle of the clock signal outputted at clkout 830 may be adjusted again if this coarsely/finely adjusted clock duty cycle still does not have a duty cycle % that falls within a threshold percentage of a 50% duty cycle (e.g., falls within 2%).

Figure 9:
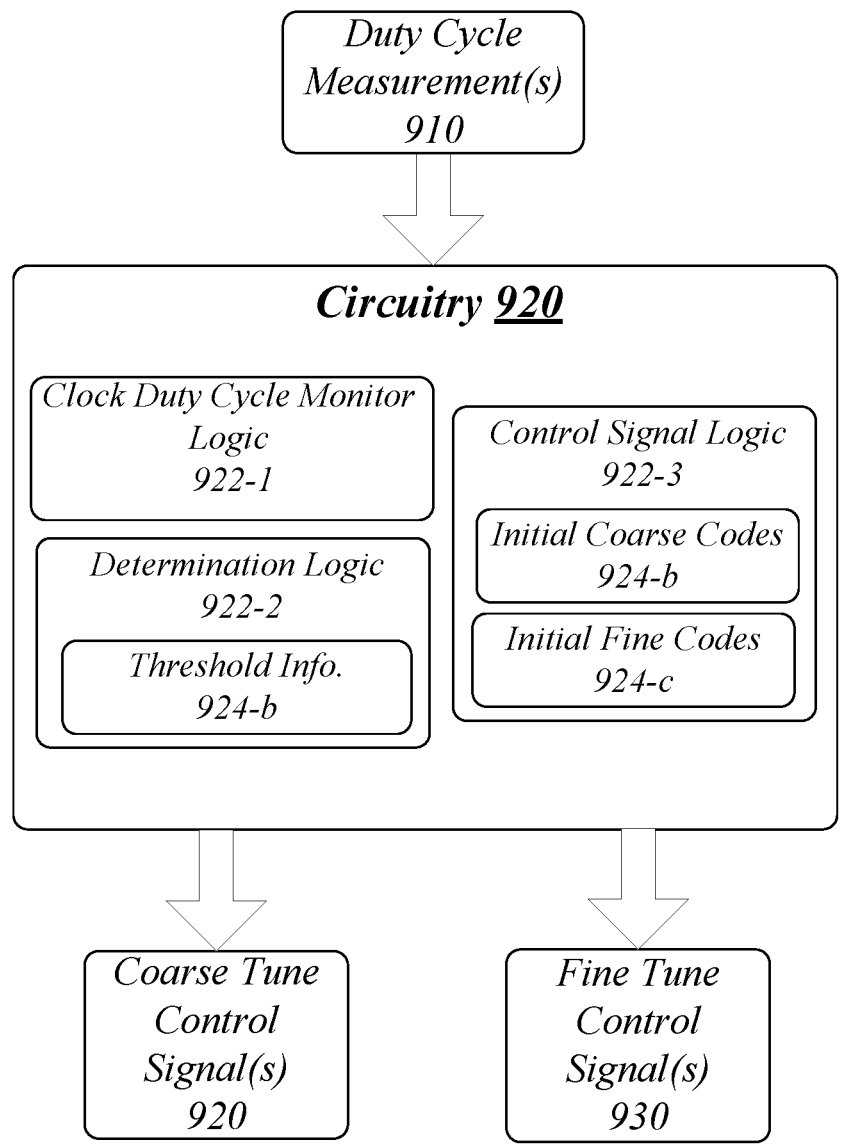
FIG. 9 illustrates an example apparatus.

FIG. 9 illustrates an example block diagram for an apparatus 900. Although apparatus 900 shown in FIG. 9 has a limited number of elements in a certain topology, it may be appreciated that the apparatus 900 may include more or less elements in alternate topologies as desired for a given implementation.

The apparatus 900 may be supported by circuitry 920 and may be maintained or located at a DIMM and/or memory devices coupled with input/output data bus arranged to operate with double data rate transfers of data on both rising and falling edges of a clock signal. In some examples, apparatus 900 may be part of a duty cycle clock measurement circuitry. Circuitry 920 may be arranged to execute one or more software or firmware implemented components or logic 922-$a$. It is worthy to note that "a" and "b" and "c" and similar designators as used herein are intended to be variables representing any positive integer. Thus, for example, if an implementation sets a value for a=3, then a complete set of software or firmware for components or logic 922-$a$ may include components or logic 922-1, 922-2 or 922-3. The examples presented are not limited in this context and the different variables used throughout may represent the same or different integer values. Also, these "components" or "logic" may be software/firmware stored in computer-readable media, and although the components are shown in FIG. 9 as discrete boxes, this does not limit these components to storage in distinct computer-readable media components (e.g., a separate memory, etc.).

According to some examples, circuitry 920 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 920 may also be an application specific integrated circuit (ASIC) and at least some components or logic 922-$a$ may be implemented as hardware elements of the ASIC. In some examples, circuitry 920 may also include a field programmable gate array (FPGA) and at least some logic 922-$a$ may be implemented as hardware elements of the FPGA.

According to some examples, apparatus 900 may include a clock duty cycle monitor logic 922-1. Clock duty cycle monitor logic 922-1 may be executed by circuitry 920 to monitor a clock duty cycle of a clock signal used for an input/output data bus. For these examples, duty cycle measurement(s) 910 may include clock duty cycle measurements of the clock signal for use to determine a duty cycle percentage of the clock signal. The clock signal may be part of a clock distribution system that may distribute the clock signal for use by various devices coupled to the input/output data bus such as memory devices and/or DIMMs. These various devices may be arranged to operate with DDR data transfers of data on both rising and falling edges of the clock signal.

In some examples, apparatus 900 may also include a determination logic 922-2. Determination logic 922-2 may be executed by circuitry 920 to determine whether the clock duty cycle has a duty cycle percentage within a threshold percentage of a target duty cycle percentage (e.g., 50%). For these examples, the threshold percentage may be maintained by determination logic 922-2 with threshold information 924-$b$ (e.g., in a lookup table (LUT)). The threshold percentage may be, but is not limited to, 2%. According to some examples, the 2% threshold percentage may be dictated by one or more memory technology specifications such as, but not limited to, memory technology specifications for DDR5, LPDDR5, HBM2, DDR4, LPDDR4, WIO2 or HBM. Meeting the 2% threshold may minimize possible timing errors caused by the clock duty cycle of the clock signal shifting too far below or above a 50% duty cycle.

According to some examples, apparatus 900 may include a control signal logic 922-3. Control signal logic 922-3 may be executed by circuitry 920 to generate multiple control signals responsive to a determination by the determination logic that the duty cycle percentage falls outside the threshold percentage. For these examples, the multiple control signals may cause a dual-range tuning of the clock duty cycle, e.g., by a slew rate controlled duty cycle corrector. The multiple control signals may include a first control signal to cause a first range of the dual-range tuning that includes a single coarse adjustment to one or more rising edges of the clock signal to coarsely tune the clock duty cycle. The first control signal may be included in coarse tune control signal(s) 920. The multiple control signals may also include a second control signal to cause a second range of the dual-range tuning that includes at least one fine adjustment to one or more falling edges of the clock signal to finely tune the clock duty cycle. The second control signal may be included in fine tune control signal(s) 930.

In some examples, control signal logic 922-3 may maintain initial coarse and fine codes in respective initial coarse codes 924-*b* and initial fine codes 924-*c* (e.g., in a same or different LUT). For these examples, the initial coarse and fine codes may be sent or forwarded, for example, to a slew rate controlled duty cycle corrector during initialization of the clock distribution system. These initial coarse and fine codes may include thermometer codes. According to some examples, a static clock duty cycle adjustment by the slew rate controlled duty cycle corrector based on the initial coarse and fine codes may correct initial clock duty cycle degradation or shifting due to possible imbalances that may occur during initialization of the clock distribution system or due to recently initialized memory devices or DIMMs coupled to the input/output data bus.

According to some examples, determination logic 922-2 may indicate completion of the dual-range tuning of the clock duty cycle responsive to the clock duty cycle of the clock signal output from the slew rate duty cycle corrector being determined to have a duty cycle percentage within the threshold percentage of the target duty cycle percentage. For example, within 48% to 52% of a target duty cycle percentage of 50%. For these examples, control signal logic 922-3 may cause the clock duty cycle of the clock signal output from the slew rate duty cycle corrector to be locked for use by the input/output data bus. In some examples, the lock may be caused by sending no additional control signals to a slew rate controlled duty cycle corrector used to tune the clock duty cycle of the clock signal.

FIG. 10 illustrates an example logic flow 1000. As shown in FIG. 10 the first logic flow includes a logic flow 1000. Logic flow 1000 may be representative of some or all of the operations executed by one or more logic, features, or devices described herein, such as apparatus 900. More particularly, logic flow 1000 may be implemented by clock duty cycle monitor logic 922-1, determination logic 922-2 or control signal logic 922-3.

According to some examples, logic flow 1000 at block 1002 may monitor a clock duty cycle of a clock signal used for an input/output data bus. For these examples, clock duty cycle monitor logic 922-1 may monitor the clock duty cycle.

In some examples, logic flow 1000 at block 1004 may determine whether the clock duty cycle has a duty cycle percentage within a threshold percentage of a target duty cycle percentage (e.g., 50%). For these example, determination logic 922-2 may make the determination.

According to some examples, logic flow 1000 at block 1006 may generate multiple control signals responsive to determining the duty cycle percentage falls outside the threshold percentage to cause a dual-range tuning of the clock duty cycle (e.g., by a slew rate controlled duty cycle corrector), the multiple control signals including a first control signal to cause a first range of the dual-range tuning that includes a multiple (or at least one) coarse adjustments to one or more rising edges of the clock signal to coarsely tune the clock duty cycle and including a second control signal to cause a second range of the dual-range tuning that includes at least one fine adjustment to one or more falling edges of the clock signal to finely tune the clock duty cycle. For these examples, control signal logic 922-3 may generate the multiple control signals.

In some examples, logic flow 1000 at block 1008 may indicate completion of the dual-range tuning of the clock duty cycle responsive to the clock duty cycle of the clock signal (e.g., output from the slew rate duty cycle corrector) having a duty cycle percentage within the threshold percentage of the target duty cycle percentage. For these examples, the determination logic may indicate the completion of the dual-range tuning.

FIG. 11 illustrates an example storage medium 1100. As shown in FIG. 11, the first storage medium includes a storage medium 1100. The storage medium 1100 may comprise an article of manufacture. In some examples, storage medium 1100 may include any non-transitory computer readable medium or machine readable medium, such as an optical, magnetic or semiconductor storage. Storage medium 1100 may store various types of computer executable instructions, such as instructions to implement logic flow 1000. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 12:
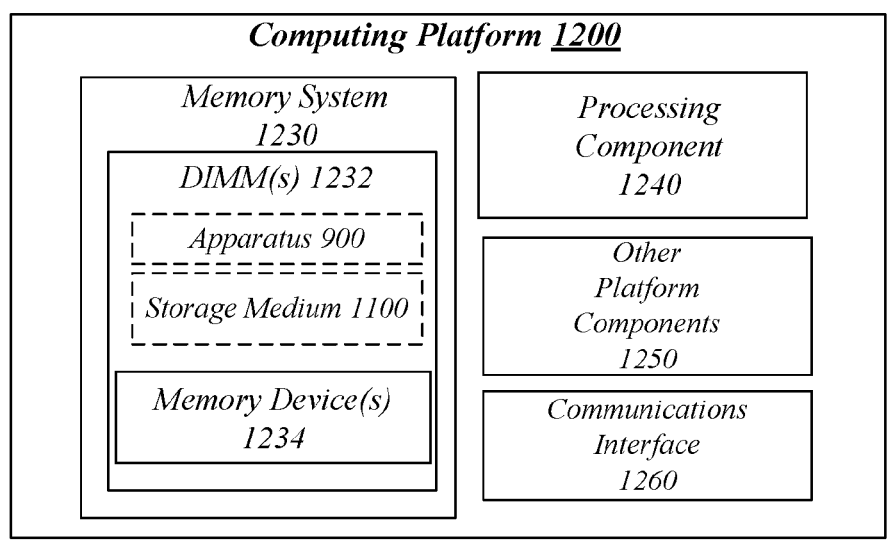
FIG. 12 illustrates an example computing platform.

FIG. 12 illustrates an example computing platform 1200. In some examples, as shown in FIG. 12, computing platform 1200 may include a memory system 1230, a processing component 1240, other platform components 1250 or a communications interface 1260. According to some examples, computing platform 1200 may be implemented in a computing device.

According to some examples, memory system 1230 may include one or more DIMM(s) 1232 and one or more memory devices(s) 1234. For these examples, logic and/or features resident at or located at with DIMM(s) 1232 and/or memory device(s) 1234 may execute at least some processing operations or logic for apparatus 900 and may include storage media that includes storage medium 1100. Also, memory device(s) 1234 may include similar types of volatile or non-volatile memory (not shown) that are described above for memory devices 122-1 to 122-*n* shown in FIG. 1. In some examples, apparatus 900 may be part of a same die with memory device(s) 1234. In other examples, apparatus 900 and memory device(s) 1234 may be located on a same die or integrated circuit with a processor (e.g., included in processing component 1240). In yet other examples, apparatus 900 may be in a separate die or integrated circuit coupled with memory device(s) 1234.

According to some examples, processing component 1240 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1250 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1250 or storage system 1230 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristors, STT-MRAM, magnetic or optical cards, and any other type of storage media suitable for storing information.

In some examples, communications interface 1260 may include logic and/or features to support a communication interface. For these examples, communications interface 1260 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 1200 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1200 described herein, may be included or omitted in various embodiments of computing platform 1200, as suitably desired.

The components and features of computing platform 1200 may be implemented using any combination of discrete circuitry, ASICs, logic gates and/or single chip architectures. Further, the features of computing platform 1200 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example apparatus may include a clock duty cycle monitor logic to monitor a clock duty cycle of a clock signal used for an input/output data bus. The apparatus may also include a determination logic to determine whether the clock duty cycle has a duty cycle percentage within a threshold percentage of a target duty cycle percentage. The apparatus may also include a control signal logic to generate multiple control signals responsive to a determination by the determination logic that the duty cycle percentage falls outside the threshold percentage. For these examples, the multiple control signals may cause a dual-range tuning of the clock duty cycle. The multiple control signals may include a first control signal to cause a first range of the dual-range tuning that includes at least one coarse adjustment to one or more rising edges of the clock signal to coarsely tune the clock duty cycle. The multiple control signals may also include a second control signal to cause a second range of the dual-range tuning that includes at least one fine adjustment to one or more falling edges of the clock signal to finely tune the clock duty cycle.

Example 2

The apparatus of example 1, the determination logic may indicate completion of the dual-range tuning of the clock duty cycle responsive to the clock duty cycle of the clock signal determined to have a duty cycle percentage within the threshold percentage of the target duty cycle percentage. For these examples, the control signal logic may cause the clock duty cycle of the clock signal to be locked for use by the input/output data bus.

Example 3

The apparatus of example 1, the multiple control signals may include a third control signal and a fourth control signal. For these examples, the third control signal may cause the first range of the dual-range tuning that includes a second at least one coarse adjustment to the one or more rising edges of the clock signal to further coarsely tune the clock duty cycle. The fourth control signal may cause the second range of the dual-range tuning that includes a second at least one fine adjustment to the one or more falling edges of the clock signal to further finely tune the clock duty cycle.

Example 4

The apparatus of example 3 may also include the determination logic indicating completion of the dual-range tuning of the clock duty cycle responsive to the clock duty cycle of the clock signal output determined to have a duty cycle percentage within the threshold percentage of the target duty cycle percentage. The apparatus may also include the control signal logic causing the clock duty cycle of the clock signal to be locked for use by the input/output data bus.

Example 5

The apparatus of example 1 may also include an adjustment to the one or more falling edges of the clock signal to coarsely tune the clock duty cycle causes the duty cycle percentage to shift approximately 3 percent. The apparatus may also include an adjustment to the one or more rising edges of the clock signal to finely tune the clock duty cycle causes the duty cycle percentage to shift approximately 0.5 percent.

Example 6

The apparatus of example 1, the threshold percentage may be 2 percent.

Example 7

The apparatus of example 1 may also include a slew rate controlled duty cycle corrector that includes a plurality of tuning modules. For these example each tuning module may separately include a current-starving inverter and stacked PMOSFETs and NMOSFETs.

Example 8

The apparatus of example 7, the first control signal generated by the control signal logic may include information to indicate whether to decrement or increment one or more first thermometer codes to control current-source legs to one or more of the PMOSFETs of the plurality of tuning modules to cause the one or more coarse adjustment to the one or more rising edges of the clock signal. Also, the second control signal generated by the control signal logic may include information to indicate whether to decrement or increment one or more second thermometer codes to control current-source legs to one or more of the NMOSFET of the plurality of tuning modules to cause the at least one fine adjustment to the one or more falling edges of the clock signal.

Example 9

The apparatus of example 1, the input/output data bus may be coupled with one or more memory devices arranged to operate with double data rate transfers of data on both rising and falling edges of the clock signal.

Example 10

The apparatus of example 9, the one or more memory devices may include volatile or non-volatile memory.

Example 11

The apparatus of example 10, the volatile memory may include RAM, D-RAM, DDR SDRAM, SRAM, T-RAM or Z-RAM.

Example 12

The apparatus of example 10, the non-volatile memory may include phase change memory that uses chalcogenide phase change material, flash memory, ferroelectric memory, SONOS memory, polymer memory, ferroelectric polymer memory, FeTRAM, FeRAM, ovonic memory, nanowire, EEPROM, phase change memory, memristors or STT-MRAM.

Example 13

The apparatus of example 9 may also include one or more of: one or more processors coupled to the input/output data bus; a network interface communicatively coupled to the apparatus; a battery coupled to the apparatus; or a display communicatively coupled to the apparatus.

Example 14

An example method may include monitoring a clock duty cycle of a clock signal used for an input/output data bus. The method may also include determining whether the clock duty cycle has a duty cycle percentage within a threshold percentage of a target duty cycle percentage. The method may also include generating multiple control signals responsive to determining the duty cycle percentage falls outside the threshold percentage to cause a dual-range tuning of the clock duty cycle. For these examples, the multiple control signals may include a first control signal to cause a first range of the dual-range tuning that includes a at least one coarse adjustment to one or more rising edges of the clock signal to coarsely tune the clock duty cycle and including a second control signal to cause a second range of the dual-range tuning that includes at least one fine adjustment to one or more falling edges of the clock signal to finely tune the clock duty cycle.

Example 15

The method according to example 14 may also include indicating completion of the dual-range tuning of the clock duty cycle responsive to the clock duty cycle of the clock signal having a duty cycle percentage within the threshold percentage of the target duty cycle percentage.

Example 16

The method of example 15, indicating completion of the dual-range tuning of the clock duty cycle may include causing the clock duty cycle of the clock signal to be locked for use by the input/output data bus.

Example 17

The method of example 14 may also include the multiple control signals including a third control signal and a fourth control signal. For these examples, the third control signal may cause the first range of the dual-range tuning that includes a second at least one coarse adjustment to the one or more rising edges of the clock signal to further coarsely tune the clock duty cycle. Also, the fourth control signal may cause the second range of the dual-range tuning that includes a second at least one fine adjustment to the one or more falling edges of the clock signal to further finely tune the clock duty cycle.

Example 18

A method according to example 17 may also include indicating completion of the dual-range tuning of the clock duty cycle responsive to the clock duty cycle of the clock having a duty cycle percentage within the threshold percentage of a the target duty cycle percentage, indicating completion of the dual-range tuning of the clock duty cycle includes causing the clock duty cycle of the clock signal to be locked for use by the input/output data bus.

Example 19

The method of example 14, an adjustment to the one or more falling edges of the clock signal may coarsely tune the clock duty cycle causes the duty cycle percentage to shift approximately 3 percent. Also, an adjustment to the one or more rising edges of the clock signal may finely tune the clock duty cycle causes the duty cycle percentage to shift approximately 0.5 percent.

Example 20

The method of example 14, the threshold percentage may be 2 percent.

Example 21

The method of example 14 may also include causing the dual-range tuning of the clock duty cycle via use of a slew rate controlled duty cycle corrector that includes a plurality of tuning modules, each tuning module separately including a current-starving inverter and stacked PMOSFETs and NMOSFETs.

Example 22

The method of example 21, the first control signal may include information to indicate whether to decrement or increment one or more first thermometer codes to control current-source legs to one or more of the PMOSFETs of the plurality of tuning modules to cause the single coarse adjustment to the one or more rising edges of the clock signal. The second control signal including information may indicate whether to decrement or increment one or more second thermometer codes to control current-source legs to one or more of the NMOSFETs of the plurality of tuning modules to cause the at least one fine adjustment to the one or more falling edges of the clock signal.

Example 23

The method of example 14, the input/output data bus may be coupled with one or more memory devices arranged to operate with double data rate transfers of data on both rising and falling edges of the clock signal.

Example 24

The method of example 23, the one or more memory devices may include volatile or non-volatile memory.

Example 25

The method of example 24, the volatile memory may include RAM, D-RAM, DDR SDRAM, SRAM, T-RAM or Z-RAM.

Example 26

The method of example 24, the non-volatile memory may include phase change memory that uses chalcogenide phase change material, flash memory, ferroelectric memory, SONOS memory, polymer memory, ferroelectric polymer memory, FeTRAM, FeRAM, ovonic memory, nanowire, EEPROM, phase change memory, memristors or STT-MRAM.

Example 27

An example at least one machine readable medium may include a plurality of instructions that in response to being executed by a system may cause the system to carry out a method according to any one of examples 13 to 26.

Example 28

An example apparatus may include means for performing the methods of any one of examples 13 to 26.

Example 29

An example system may include an input/output data bus. The system may also include one or more memory devices coupled with the input/output data bus and arranged to operate with double data rate transfers of data on both rising and falling edges of a clock signal. The system may also include a slew rate controlled duty cycle corrector to tune a clock duty cycle of the clock signal. The system may also include duty cycle clock measurement circuitry. The duty cycle clock measurement circuitry may monitor the clock duty cycle of the clock signal. The duty cycle clock measurement circuitry may also determine whether the clock duty cycle has a duty cycle percentage within a threshold percentage of a target duty cycle percentage. The duty cycle clock measurement circuitry may also generate multiple control signals responsive to a determination that the duty cycle percentage falls outside the threshold percentage, the multiple control signals to cause a dual-range tuning of the clock duty cycle by the slew rate controlled duty cycle corrector. The multiple control signals may include a first control signal to cause a first range of the dual-range tuning that includes at least one coarse adjustment to one or more rising edges of the clock signal to coarsely tune the clock duty cycle and the multiple control signals to also include a second control signal to cause a second range of the dual-range tuning that includes at least one fine adjustment to one or more falling edges of the clock signal to finely tune the clock duty cycle.

Example 30

The system of example 29, the duty cycle clock measurement circuitry may also indicate completion of the dual-range tuning of the clock duty cycle responsive to the clock duty cycle of the clock signal output from the slew rate duty cycle corrector determined to have a duty cycle percentage within the threshold percentage of the target duty cycle threshold. The duty cycle clock measurement circuitry may also cause the clock duty cycle of the clock signal output from the slew rate duty cycle corrector to be locked for use by the input/output data bus.

Example 31

The system of example 29, the multiple control signals may include a third control signal and a fourth control signal, the third control signal to cause the first range of the dual-range tuning that includes a second at least one coarse adjustment to the one or more rising edges of the clock signal to further coarsely tune the clock duty cycle. For these examples, the fourth control signal may cause the second range of the dual-range tuning that includes a second at least one fine adjustment to the one or more falling edges of the clock signal to further finely tune the clock duty cycle.

Example 32

The system of example 31, the duty cycle clock measurement circuitry may also indicate completion of the dual-range tuning of the clock duty cycle responsive to the clock duty cycle of the clock signal output from the slew rate duty cycle corrector determined to have a duty cycle percentage within the threshold percentage of the target duty cycle percentage. The duty cycle clock measurement circuitry may also cause the clock duty cycle of the clock signal output from the slew rate duty cycle corrector to be locked for use by the input/output data bus.

Example 33

The system of example 29, the duty cycle clock measurement circuitry to cause an adjustment to the one or more falling edges of the clock signal to coarsely tune the clock duty cycle that causes the duty cycle percentage to shift approximately 3 percent. The duty cycle clock measurement circuitry may also cause an adjustment to the one or more rising edges of the clock signal to finely tune the clock duty cycle that causes the duty cycle percentage to shift approximately 0.5 percent.

Example 34

The system of example 29, the threshold percentage may be 2 percent.

Example 35

The system of example 29, the slew rate controlled duty cycle corrector may include a plurality of tuning modules. For these example each tuning module may separately include a current-starving inverter and stacked PMOSFETs and NMOSFETs.

Example 36

The system of example 35, the first control signal generated by the duty cycle clock measurement circuitry may include information to indicate whether to decrement or increment one or more first thermometer codes to control current-source legs to one or more of the PMOSFETs of the plurality of tuning modules to cause the at least one coarse adjustment to the one or more rising edges of the clock signal. The second control signal generated by the duty cycle clock measurement circuitry may include information to indicate whether to decrement or increment one or more second thermometer codes to control current-source legs to one or more of the NMOSFETs of the plurality of tuning modules to cause the at least one fine adjustment to the one or more falling edges of the clock signal.

Example 37

The system of example 29, the one or more memory devices may include volatile or non-volatile memory.

Example 38

The system of example 37, the volatile memory may include RAM, D-RAM, DDR SDRAM, SRAM, T-RAM or Z-RAM.

Example 39

The system of example 37, the non-volatile memory may include phase change memory that uses chalcogenide phase change material, flash memory, ferroelectric memory, SONOS memory, polymer memory, ferroelectric polymer memory, FeTRAM, FeRAM, ovonic memory, nanowire, EEPROM, phase change memory, memristors or STT-MRAM.

Example 40

The system of example 29 may also include one or more of: one or more processors coupled to the input/output data bus; a network interface communicatively coupled to the system; a battery coupled to the system; or a display communicatively coupled to the system.

In the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus comprising:
   a clock duty cycle monitor logic to monitor a clock duty cycle of a clock signal used for an input/output data bus;
   a determination logic to determine whether the clock duty cycle has a duty cycle percentage within a threshold percentage of a target duty cycle percentage; and
   a control signal logic to generate multiple control signals responsive to a determination by the determination logic that the duty cycle percentage falls outside the threshold percentage, the multiple control signals to cause a dual-range tuning of the clock duty cycle, the multiple control signals to include a first control signal to cause a first range of the dual-range tuning that includes at least one coarse adjustment to one or more rising edges of the clock signal to coarsely tune the clock duty cycle that causes the duty cycle percentage to shift approximately 3 percent and the multiple control signals to also include a second control signal to cause a second range of the dual-range tuning that includes at least one fine adjustment to one or more falling edges of the clock signal to finely tune the clock duty cycle that causes the duty cycle percentage to shift approximately 0.5 percent.

2. The apparatus of claim 1, comprising:
   the determination logic to indicate completion of the dual-range tuning of the clock duty cycle responsive to the clock duty cycle of the clock signal determined to have a duty cycle percentage within the threshold percentage of the target duty cycle percentage; and
   the control signal logic to cause the clock duty cycle of the clock signal to be locked for use by the input/output data bus.

3. The apparatus of claim 1, comprising the multiple control signals to include a third control signal and a fourth control signal, the third control signal to cause the first range of the dual-range tuning that includes a second at least one coarse adjustment to the one or more rising edges of the clock signal to further coarsely tune the clock duty cycle, the fourth control signal to cause the second range of the dual-range tuning that includes a second at least one fine adjustment to the one or more falling edges of the clock signal to further finely tune the clock duty cycle.

4. The apparatus of claim 3, comprising:
   the determination logic to indicate completion of the dual-range tuning of the clock duty cycle responsive to the clock duty cycle of the clock signal determined to have a duty cycle percentage within the threshold percentage of the target duty cycle percentage; and
   the control signal logic to cause the clock duty cycle of the clock signal to be locked for use by the input/output data bus.

5. The apparatus of claim 1, further comprising a slew rate controlled duty cycle corrector that includes a plurality of tuning modules, each tuning module separately including a current-starving inverter and stacked p-type metal-oxide-semiconductor (PMOS) field effect transistors (PMOSFETs) and n-type metal-oxide-semiconductor (NMOS) field effect transistors (NMOSFETs).

6. The apparatus of claim 5, comprising:
the first control signal generated by the control signal logic includes information to indicate whether to decrement or increment one or more first thermometer codes to control current-source legs to one or more of the PMOSFETs of the plurality of tuning modules to cause the one or more coarse adjustment to the one or more rising edges of the clock signal; and
the second control signal generated by the control signal logic includes information to indicate whether to decrement or increment one or more second thermometer codes to control current-source legs to one or more of the NMOSFETs of the plurality of tuning modules to cause the at least one fine adjustment to the one or more falling edges of the clock signal.

7. The apparatus of claim 6, comprising the input/output data bus coupled with one or more memory devices arranged to operate with double data rate transfers of data on both rising and falling edges of the clock signal.

8. The apparatus of claim 7, the one or more memory devices including volatile or non-volatile memory.

9. The apparatus of claim 8, the volatile comprising random-access memory (RAM), Dynamic RAM (D-RAM), double data rate synchronous dynamic RAM (DDR SDRAM), static random-access memory (SRAM), Thyristor RAM (T-RAM) or zero-capacitor RAM (Z-RAM).

10. The apparatus of claim 8, the non-volatile memory comprising phase change memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque—magnetoresistive random access memory (STT-MRAM).

11. The apparatus of claim 7, comprising one or more of:
one or more processors coupled to the input/output data bus;
a network interface communicatively coupled to the apparatus;
a battery coupled to the apparatus; or
a display communicatively coupled to the apparatus.

12. A method comprising:
monitoring a clock duty cycle of a clock signal used for an input/output data bus;
determining whether the clock duty cycle has a duty cycle percentage within a threshold percentage of a target duty cycle percentage; and
generating multiple control signals responsive to determining the duty cycle percentage falls outside the threshold percentage to cause a dual-range tuning of the clock duty cycle, the multiple control signals including a first control signal to cause a first range of the dual-range tuning that includes at least one coarse adjustment to one or more rising edges of the clock signal to coarsely tune the clock duty cycle that causes the duty cycle percentage to shift approximately 3 percent and including a second control signal to cause a second range of the dual-range tuning that includes at least one fine adjustment to one or more falling edges of the clock signal to finely tune the clock duty cycle that causes the duty cycle percentage to shift approximately 0.5 percent.

13. The method of claim 12, comprising:
indicating completion of the dual-range tuning of the clock duty cycle responsive to the clock duty cycle of the clock signal having a duty cycle percentage within the threshold percentage of the target duty cycle percentage.

14. The method of claim 13, indicating completion of the dual-range tuning of the clock duty cycle comprises causing the clock duty cycle of the clock signal to be locked for use by the input/output data bus.

15. The method of claim 13, comprising the multiple control signals including a third control signal and a fourth control signal, the third control signal to cause the first range of the dual-range tuning that includes a second at least one coarse adjustment to the one or more rising edges of the clock signal to further coarsely tune the clock duty cycle, the fourth control signal to cause the second range of the dual-range tuning that includes a second at least one fine adjustment to the one or more falling edges of the clock signal to further finely tune the clock duty cycle.

16. The method according to claim 15, comprising:
indicating completion of the dual-range tuning of the clock duty cycle responsive to the clock duty cycle of the clock having a duty cycle percentage within the threshold percentage of a the target duty cycle percentage, indicating completion of the dual-range tuning of the clock duty cycle includes causing the clock duty cycle of the clock signal to be locked for use by the input/output data bus.

17. The method of claim 12, further comprising:
causing the dual-range tuning of the clock duty cycle via use of a slew rate controlled duty cycle corrector that includes a plurality of tuning modules, each tuning module separately including a current-starving inverter and stacked p-type metal-oxide-semiconductor (PMOS) field effect transistors (PMOSFETs) and n-type metal-oxide-semiconductor (NMOS) field effect transistors (NMOSFETs).

18. The method of claim 17, comprising:
the first control signal including information to indicate whether to decrement or increment one or more first thermometer codes to control current-source legs to one or more of the PMOSFET of the plurality of tuning modules to cause the at least one coarse adjustment to the one or more rising edges of the clock signal; and
the second control signal including information to indicate whether to decrement or increment one or more second thermometer codes to control current-source legs to one or more of the NMOSFETs of the plurality of tuning modules to cause the at least one fine adjustment to the one or more falling edges of the clock signal.

19. The method of claim 12, comprising the input/output data bus coupled with one or more memory devices arranged to operate with double data rate transfers of data on both rising and falling edges of the clock signal.

20. The method of claim 19, the one or more memory devices including volatile or non-volatile memory.

21. The method of claim 20, wherein the volatile memory comprising random-access memory (RAM), Dynamic RAM (D-RAM), double data rate synchronous dynamic RAM (DDR SDRAM), static random-access memory (SRAM), Thyristor RAM (T-RAM) or zero-capacitor RAM (Z-RAM).

22. The method of claim 20, wherein the non-volatile memory comprising phase change memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque—magnetoresistive random access memory (STT-MRAM).

* * * * *